(12) United States Patent
Seeber et al.

(10) Patent No.: US 7,962,019 B2
(45) Date of Patent: Jun. 14, 2011

(54) SYSTEM, METHOD AND APPARATUS FOR CONTROLLING DRIFT OF A MAIN MAGNETIC FIELD IN AN MRI SYSTEM

(75) Inventors: Derek A. Seeber, Florence, SC (US); Tomas Duby, Florence, SC (US)

(73) Assignee: General Electric Company, Schenectady, NY (US)

( * ) Notice: Subject to any disclaimer, the term of this patent is extended or adjusted under 35 U.S.C. 154(b) by 804 days.

(21) Appl. No.: 11/937,839

(22) Filed: Nov. 9, 2007

(65) Prior Publication Data
US 2009/0123139 A1 May 14, 2009

(51) Int. Cl.
*A21B 2/00* (2006.01)
*F24C 7/00* (2006.01)

(52) U.S. Cl. ......... 392/416; 392/407; 324/300; 324/703

(58) Field of Classification Search .................. 392/416, 392/407
See application file for complete search history.

(56) References Cited

U.S. PATENT DOCUMENTS

| | | | |
|---|---|---|---|
| 5,101,638 A * | 4/1992 | White ............................. 62/51.1 |
| 5,652,517 A * | 7/1997 | Maki et al. .................... 324/318 |
| 6,326,788 B1 * | 12/2001 | Mulder et al. ................ 324/318 |
| 6,771,072 B2 | 8/2004 | Schuster et al. |
| 6,788,060 B1 | 9/2004 | Feenan et al. |
| 6,812,705 B1 | 11/2004 | Sellers |
| 6,891,375 B2 * | 5/2005 | Goto et al. .................... 324/320 |
| 6,992,483 B1 | 1/2006 | Emeric et al. |
| 7,135,863 B2 | 11/2006 | Arik et al. |
| 7,193,416 B2 | 3/2007 | Harvey et al. |
| 7,301,343 B1 | 11/2007 | Sellers |
| 7,741,847 B2 * | 6/2010 | Nakabayashi et al. ........ 324/320 |
| 2001/0042385 A1 | 11/2001 | Kaindl et al. |
| 2002/0156595 A1 | 10/2002 | Hedlund et al. |
| 2005/0104701 A1 | 5/2005 | Huang et al. |
| 2006/0113995 A1 * | 6/2006 | Jarvis et al. ................... 324/318 |
| 2007/0080689 A1 | 4/2007 | Konijn et al. |
| 2007/0101742 A1 * | 5/2007 | Laskaris et al. .............. 62/259.2 |
| 2007/0216413 A1 * | 9/2007 | Legall et al. .................. 324/320 |
| 2008/0047948 A1 * | 2/2008 | Rosenbloom et al. ........ 219/386 |

* cited by examiner

*Primary Examiner* — Thor S Campbell

(57) ABSTRACT

An apparatus for controlling the temperature of a warm bore of a superconducting magnet in a magnetic resonance imaging (MRI) includes a plurality of warm bore thermal sensors positioned on a surface of the warm bore and a plurality of heater elements positioned on the surface of the warm bore. A heater element thermal sensor is coupled to each of the plurality of heater elements and configured to monitor the temperature of the corresponding heater element. A controller is coupled to the plurality of warm bore thermal sensors and the plurality of heater element thermal sensors. The controller is configured to control each of the plurality of heater elements to maintain a predetermined temperature of the warm bore.

21 Claims, 6 Drawing Sheets

SYSTEM, METHOD AND APPARATUS FOR CONTROLLING DRIFT OF A MAIN MAGNETIC FIELD IN AN MRI SYSTEM

FIELD OF THE INVENTION

The present invention relates generally to a magnetic resonance imaging (MRI) system and in particular to a system, method and apparatus for controlling drift of a main magnetic field, $B_0$, during operation of an MRI system.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

MRI systems require a uniform main magnetic field, $B_0$, in the imaging volume that should remain homogeneous and constant in time over a wide range of pulse sequences and protocols. Changes or drift in the main magnetic field can affect the performance of the MRI system including data acquisition and reconstruction of an MR image. During a patient scan, the gradient coil(s) of the gradient coil assembly, which produce the magnetic field gradients, dissipate large amounts of heat. The heat produced by the gradient coils can cause an increase in temperature of the magnet warm bore, for example, by radiation, convection or conduction heating. In addition, the magnet warm bore temperature may increase as a result of eddy currents. A magnet warm bore surface is typically made of low magnetic permeability stainless steel, however, the stainless steel may have residual permeability, also known as paramagnetism. According to Curie's law, the permeability of a paramagnetic material changes as the temperature of the material changes. Accordingly, the heating of the magnet's stainless steel warm bore due to the heat generated by the gradient coils and eddy currents changes the permeability of the stainless steel warm bore. Typically, the permeability of the warm bore will decrease as the temperature of the warm bore increases. The change in permeability of the magnet warm bore can result in a change or drift in the main magnetic field which in turn can have a negative impact on image quality.

It would be desirable to provide a system, method and apparatus for controlling the change or drift of the main magnetic field. It would be advantageous to control or compensate for the change or drift of the main magnetic field based on the temperature and permeability of the magnet warm bore.

BRIEF DESCRIPTION OF THE INVENTION

In accordance with an embodiment, an apparatus for controlling a temperature of a warm bore of a superconducting magnet in a magnetic resonance imaging (MRI) system includes a plurality of warm bore thermal sensors positioned on a surface of the warm bore, a plurality of heater elements positioned on the surface of the warm bore, a plurality of heater element thermal sensors, each heater element thermal sensor coupled to one of the plurality of heater elements and configured to monitor a temperature of the corresponding heater element and a controller coupled to the plurality of warm bore thermals sensors and the plurality of heater element thermal sensors, the controller configured to control each of the plurality of heater elements to maintain a predetermined temperature of the warm bore.

In accordance with another embodiment, a method for controlling a temperature of a warm bore of a superconducting magnet in a magnetic resonance imaging (MRI) system, the magnet including a plurality of heater elements positioned on a surface of the warm bore, includes monitoring the temperature of the warm bore, monitoring a temperature of each heater element in the plurality of heater elements and adjusting the temperature of each heater element to maintain a predetermined temperature of the warm bore.

In accordance with another embodiment, an apparatus for controlling a temperature of a warm bore of a superconducting magnet in a magnetic resonance imaging (MRI) system includes a plurality of warm bore thermal sensors positioned on a surface of the warm bore, a plurality of heater elements positioned on the surface of the warm bore, a plurality of heater element thermal sensors, each heater element thermal sensor coupled to a subset of the plurality of heater elements and configured to monitor a temperature of the corresponding subset of heater elements, and a controller coupled to the plurality of warm bore thermals sensors and the plurality of heater element thermal sensors, the controller configured to control the subset of the plurality of heater elements to maintain a predetermined temperature of the warm bore.

In accordance with another embodiment, an apparatus for controlling a temperature of a warm bore of a superconducting magnet of a magnetic resonance imaging (MRI) system, the MRI system including a gradient coil assembly mounted inside and circumferentially surrounded by the superconducting magnet, includes an eddy current shield disposed around an outer surface of the gradient coil assembly and a plurality of heater elements positioned on a surface of the warm bore.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION

Figure 1:
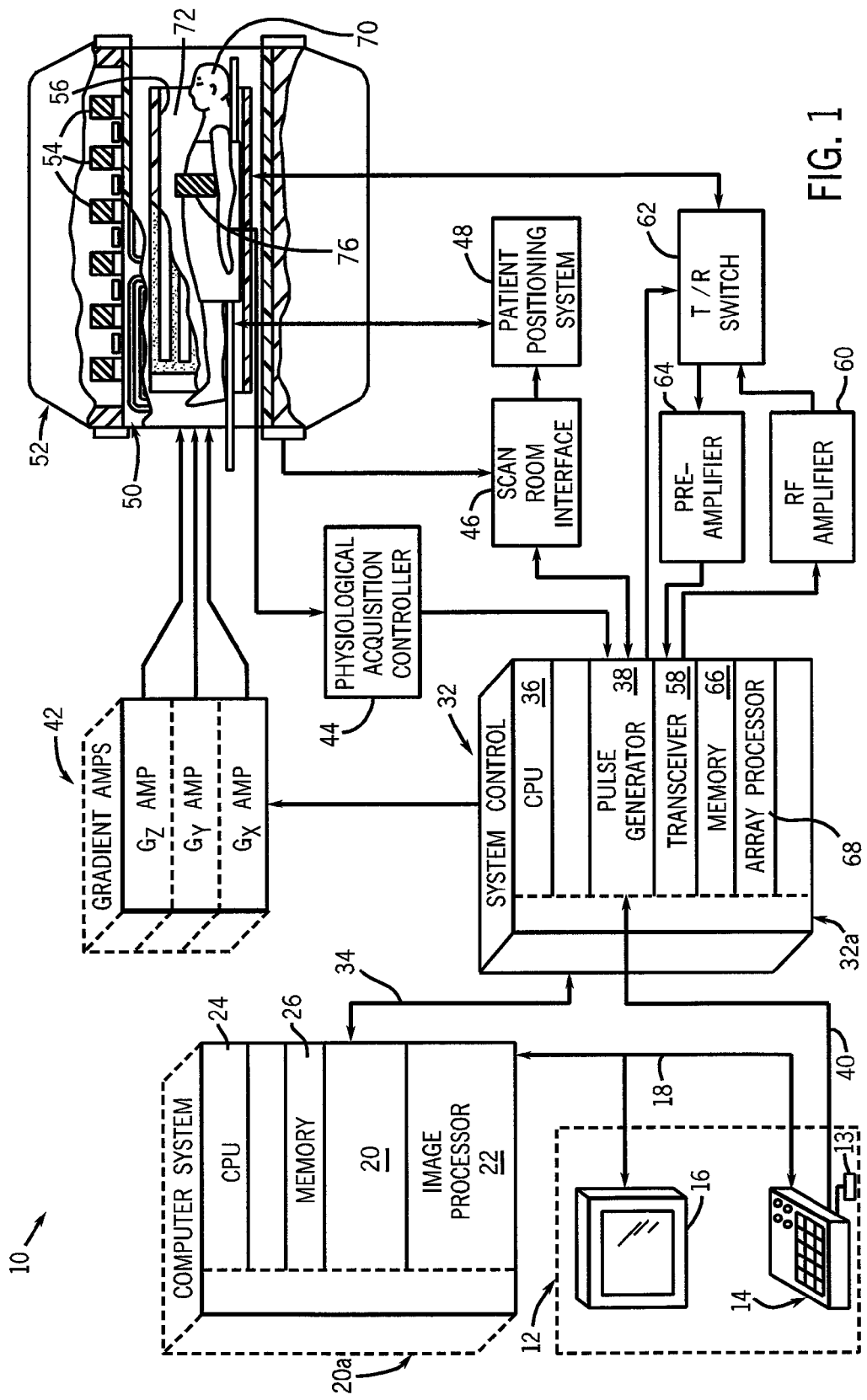
FIG. 1 is a schematic block diagram of an exemplary magnetic resonance imaging system in accordance with an embodiment.

FIG. 1 is a schematic block diagram of an exemplary magnetic resonance imaging system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., magnet assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests (e.g., radio frequency (RF) waveforms) describing the timing, strength and shape of the RF pulses and pulse sequences to be produced and the timing and length of the data acquisition window. The pulse generator module 38 connects to a gradient amplifier system 42 and produces data called gradient waveforms which control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$ and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a magnet assembly 52 that includes a polarizing superconducting magnet with superconducting main coils 54. Magnet assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the magnet assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on display 16.

Figure 2:
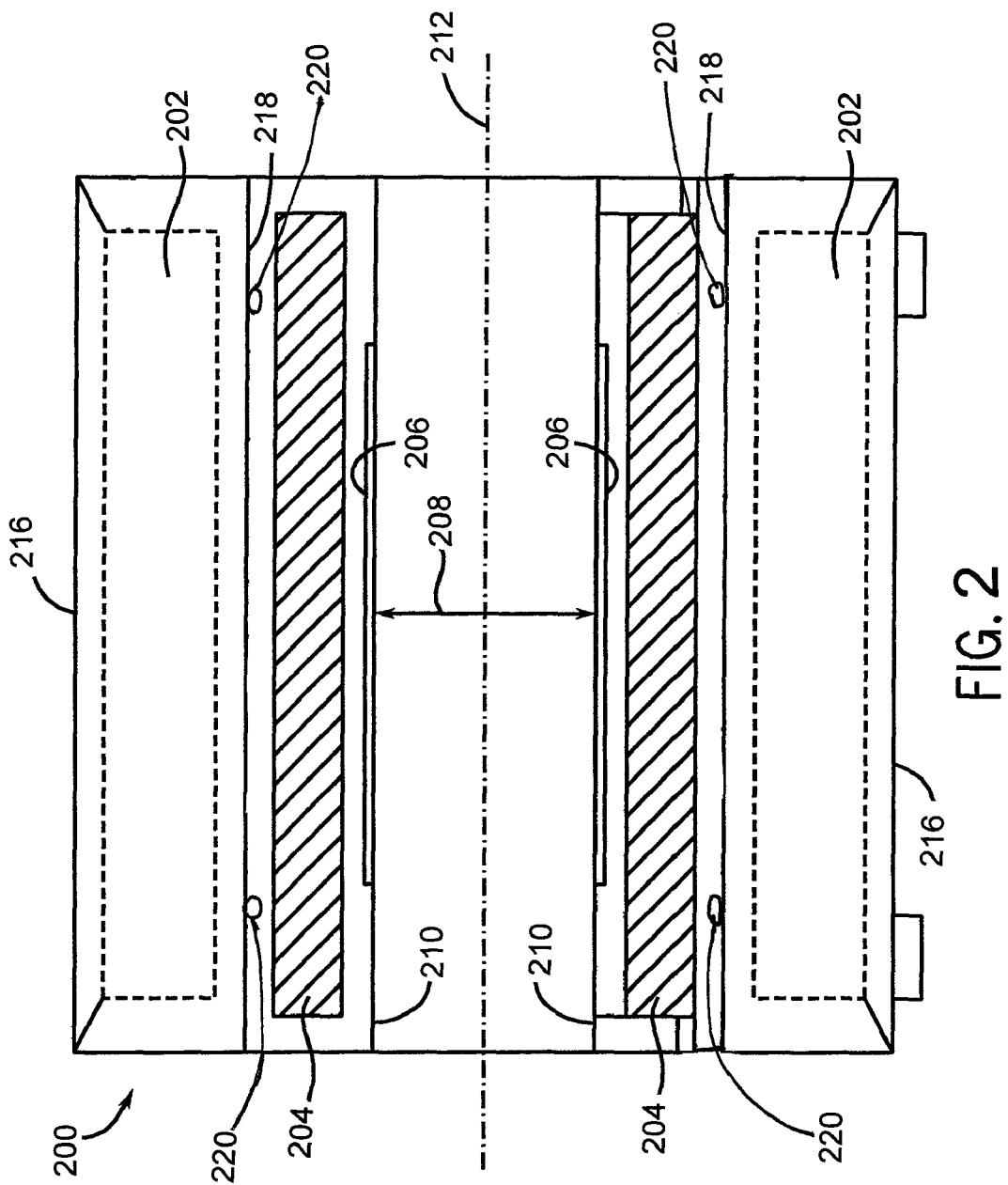
FIG. 2 is a cross-sectional side elevation view of an exemplary magnet assembly in accordance with an embodiment.

FIG. 2 is a schematic cross-sectional side elevation view of an exemplary magnet assembly (e.g., magnet assembly 52 shown in FIG. 1) in accordance with an embodiment. Magnet assembly 200 is cylindrical and annular in shape and is compatible with the above-described MRI system of FIG. 1 or any similar or equivalent system for obtaining MR images. While the following describes a cylindrical magnet assembly topology, it should be understood that other magnet assembly topologies may utilize the embodiments of the invention described herein. Magnet assembly 200 includes, among other elements, a superconducting magnet 202, a gradient coil assembly 204 and an RF coil 206. Various other elements, such as magnet coils, cryostat elements, supports, suspension members, end caps, brackets, etc. are omitted from FIG. 2 for clarity. A cylindrical patient volume or space 208 is surrounded by a patient bore tube 210. RF coil 206 is mounted on an outer surface of the patient bore tube 210 and mounted inside the gradient coil assembly 204. The gradient coil assembly 204 is disposed around the RF coil 206 in a spaced apart coaxial relationship and the gradient coil assembly 204 circumferentially surrounds the RF coil 206. Gradient coil assembly 204 is mounted inside a warm bore 218 of the magnet 202 and is circumferentially surrounded by magnet 202.

A patient or imaging subject 70 (shown in FIG. 1) may be inserted into the magnet assembly 200 along a center axis 212 (e.g., a z-axis) on a patient table or cradle (not shown in FIG. 2). Center axis 212 is aligned along the tube axis of the magnet assembly 200 parallel to the direction of a main magnetic field, $B_0$, generated by the magnet 202. RF coil 206 is used to apply a radio frequency pulse (or a plurality of pulses) to a patient or subject and to receive MR information back from the subject. Gradient coil assembly 204 generates time dependent gradient magnetic pulses that are used to spatially encode points in the imaging volume 208.

Superconducting magnet 202 may include, for example, several radially aligned and longitudinally spaced-apart superconductive main coils (not shown), each capable of carrying a large, identical electric current. The superconductive main coils are designed to create a magnetic field, $B_0$, within the patient volume 208. Superconducting magnet 202 is enclosed in a cryogenic environment within a magnet vessel 216 (or cryostat) designed to maintain the temperature of the superconductive coils below the appropriate critical temperature so that the coils are in a superconducting state with zero resistance. Magnet vessel 216 may include, for example, a helium vessel and thermal or cold shields for containing and cooling the magnet coils in a known manner. The warm bore 218 is defined by an inner cylindrical surface of the magnet vessel 216 and is typically made of metal such as stainless steel.

Heat dissipated from the gradient coil assembly 204 during operation may increase the temperature of the warm bore 218 (e.g., by radiation, convection or conduction) of the magnet assembly 200. The warm bore 218 may also be heated as a result of eddy currents generated during operation of the gradient coil assembly 204. As the temperature of the warm bore 218 increases, the permeability of the warm bore changes (typically decreases, in accordance with Curie's Law) which can result in a change or drift in the main magnetic field, $B_0$. Thus, the main magnetic field may increase with increased temperature and decreased permeability of the warm bore 218. In order to control (e.g., to minimize) the change or drift in the main magnetic field resulting from a temperature induced change in permeability, the temperature of the warm bore 218 may be maintained at a constant temperature.

Figure 3:
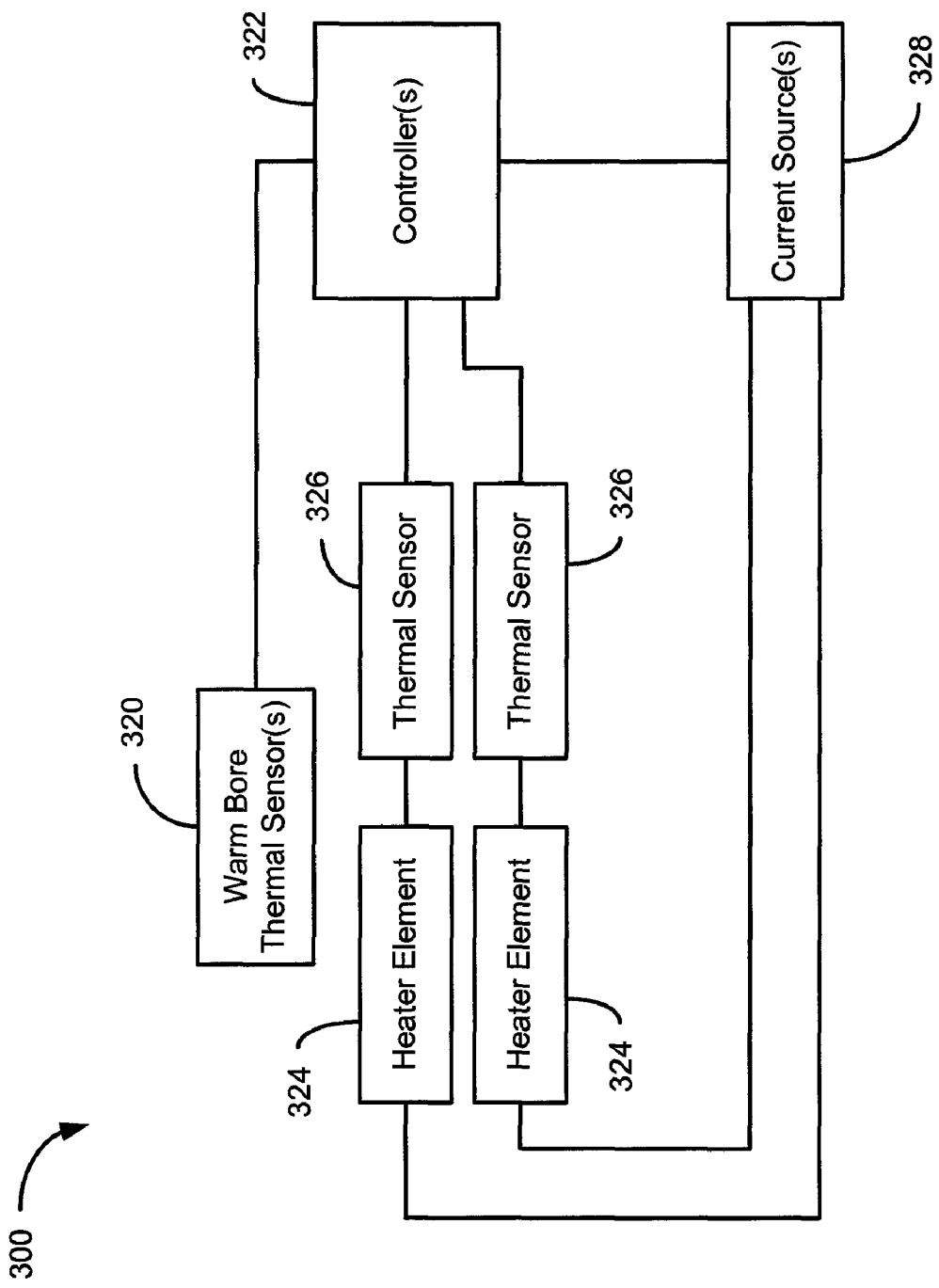
FIG. 3 is a schematic block diagram of a system for controlling a temperature of a warm bore of a superconducting magnet in a magnetic resonance imaging (MRI) system in accordance with an embodiment.

FIG. 3 is a schematic block diagram of a system for controlling the temperature of a warm bore of a superconducting magnet in accordance with an embodiment. The system 300 is compatible with the magnet assembly and MRI system described above with respect to FIGS. 1 and 2 or any similar or equivalent magnet assembly and MRI system. The system 300 includes a plurality of warm bore thermal sensors 320, a plurality of heater elements 324, a thermal sensor 326 for each heater element 324, at least one controller 322 and at least one current source 328. A plurality of warm bore thermal sensors 320 are attached to the surface of the warm bore. In FIG. 2, a plurality of warm bore thermal sensors 220 are shown positioned on the warm bore 218. While four warm bore thermal sensors 220 are shown, it should be understood that fewer or more thermal sensors 220 may be used. Returning to FIG. 3, the warm bore thermal sensors 320 may be, for example, thermocouples, thermistors, resistance temperature devices (RTDs), etc. In one embodiment, the RTD is an RTD with non-metallic housing (e.g., a four wire platinum, Teflon encased RTD) to minimize the amount of metal in the RTD. In another embodiment, the RTD may include a shorting capacitor to short out RF noise on the RTD. The warm bore thermal sensors 320 are positioned on the warm bore surface to obtain an average temperature of the warm bore. For example, in various embodiments, a warm bore thermal sensor 320 may be positioned at four or eight locations on the warm bore surface. The locations of each of the warm bore thermal sensors 320 is chosen to sufficiently track the average temperature of the warm bore. The warm bore thermal sensors 320 provide a signal or signals to a controller (or controllers) 322 that indicate the temperature at the corresponding location on the warm bore.

Figure 4:
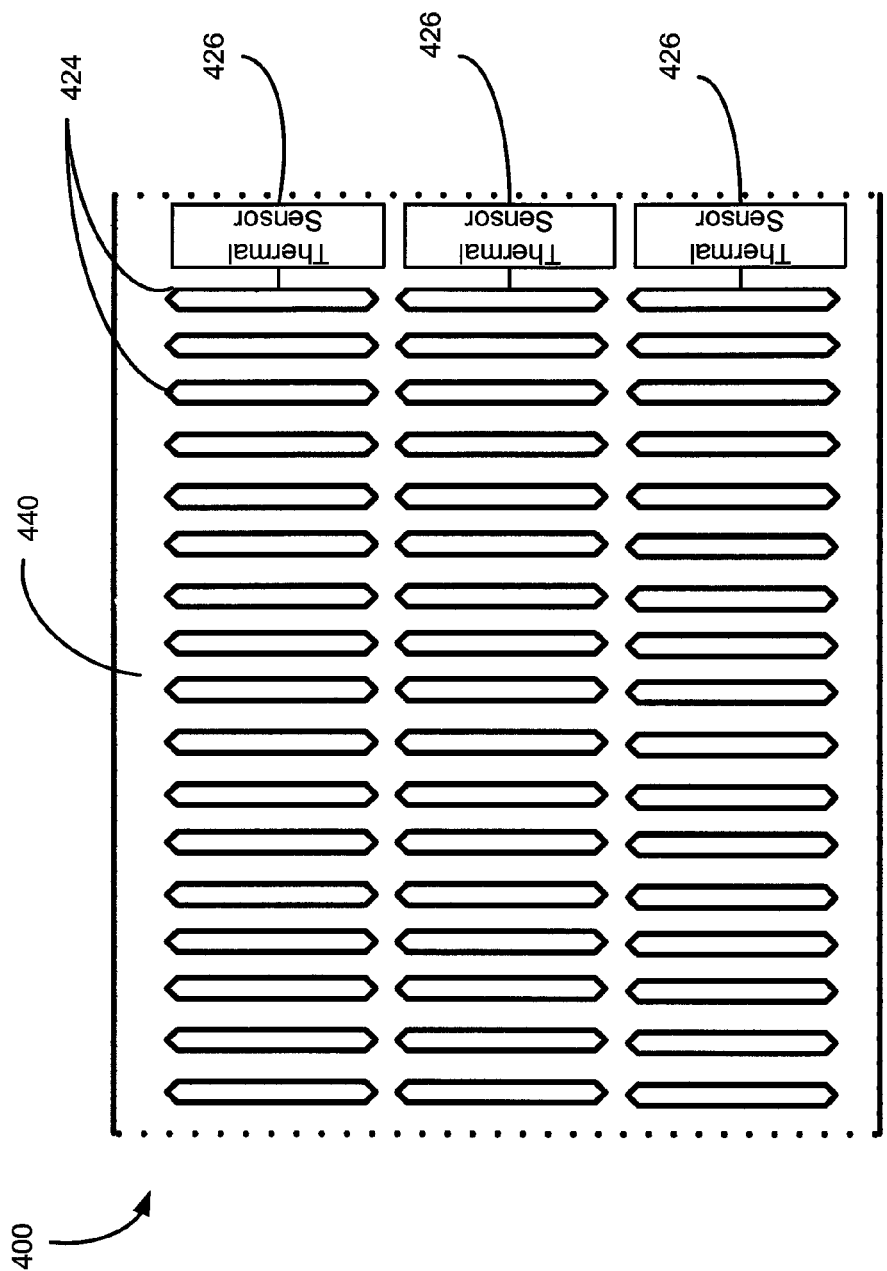
FIG. 4 is a schematic diagram of an exemplary array of heater elements on a warm bore used to maintain a constant temperature of the warm bore in accordance with an embodiment.

A plurality of heater elements 324 is attached to the inside surface of the warm bore. While two heater elements 324 are shown in FIG. 3, it should be understood that more heater elements 324 may be used in the system 300. A separate thermal sensor 326 may be connected to and in thermal contact with each heater element 324 to monitor the temperature of the corresponding heater element 324. FIG. 4 is a schematic diagram of an exemplary array of heater elements on a warm bore used to maintain a constant temperature of the warm bore in accordance with an embodiment. FIG. 4 shows an exploded view of the inside surface of the warm bore. The array 400 includes a plurality of heater elements 424 and is configured to maintain the temperature of the warm bore 440 at a constant predetermined temperature. The heater elements 424 may be attached to the warm bore 440 using an adhesive (for example, double sided tape or glue). The number of heater elements 424 in the array 400 is preferably based on the number of locations on the warm bore surface 440 necessary to achieve a uniform heating of the warm bore surface 440. In one embodiment, the array 400 includes more than fifty (50) heater elements 424. Each heater element 424 may be connected to and in thermal contact with a separate thermal sensor or temperature monitoring device 426, e.g., a thermocouple, a thermistor, a resistance temperature device (RTD), etc. In FIG. 4, only three thermal sensors (or temperature monitoring devices) 426 are shown for clarity, however, it should be understood that each heater element 424 in the array 400 may be coupled to a separate thermal sensor 424. In an alternative embodiment, the heater elements 424 of array 400 may be divided into subsets or groups and each subset or group of heater elements is coupled to a separate thermal sensor 426. Each thermal sensor 426 is configured to monitor the temperature of the corresponding heater element or elements 424. Each thermal sensor 426 provides a signal(s) indicating the temperature of the corresponding heater element (or elements) 424 to a controller 322, as shown in FIG. 3.

Returning to FIG. 3, controller 322 is coupled to the warm bore thermal sensor(s) 320 and the heater element thermal sensor(s) 326. Controller(s) 322 may be, for example, integrated in a computer system 20 (shown in FIG. 1) or system control 32 (shown in FIG. 1) of the MRI system. Controller 322 is configured to control each heater element 324 to maintain the temperature of the warm bore at a constant predetermined temperature. Controller 322 may implement, for example, proportional-integral-derivative (PID) control of the heater element 324 temperatures based on the measured warm bore temperature input and the heater element(s) 324 temperature inputs. Controller 322 is coupled to a current source (or a plurality of current sources) 328 such as a temperature controlled current source. Current source(s) 328 are coupled to the heater elements 324. In one embodiment, each heater element 324 is coupled to a separate current source 328. In another embodiment, the plurality of heater elements 324 may be divided into subsets or groups and each subset or group of heater elements 324 is coupled to a separate current source 328. Preferably, current source (or sources) 328 is an AC (alternating current) current source so that it does not cause interference with the magnetic field(s) of the MRI system.

Based on the warm bore temperature and heater element 324 temperature, controller 322 provides a control signal to current source(s) 328 which in turn adjusts or changes the current provided to each heater element 324 to control the heat generated by each heater element 324 to maintain a constant predetermined temperature of the warm bore. In some instances, the heating of the warm bore may not be uniform, for example, as a result of localized heating due to eddy currents. Accordingly, controller 322 and the corresponding current source(s) 328 may adjust the current provided to each heater element (or a subset of heater elements) 324 separately so that the heat provided by heater elements 324 in the particular location of the localized heating may be controlled to keep the temperature of the warm bore constant, i.e., at the constant predetermined temperature. In one embodiment, the constant predetermined temperature is an elevated temperature above an ambient temperature so that the warm bore temperature is not affected by the gradient coil heating. For example, the elevated temperature may be a temperature greater than the maximum warm bore temperature expected as a result of gradient heating at maximum power. In addition, by selecting a predetermined temperature that is elevated, the heater elements 324 may be turned down (i.e., temperature decreased) if necessary to maintain a constant temperature of the warm bore. By controlling each heater element 324 to maintain a constant temperature, the temperature-induced change in permeability of the warm bore is reduced or eliminated and will minimize the drift in the main magnetic field.

Figure 5:
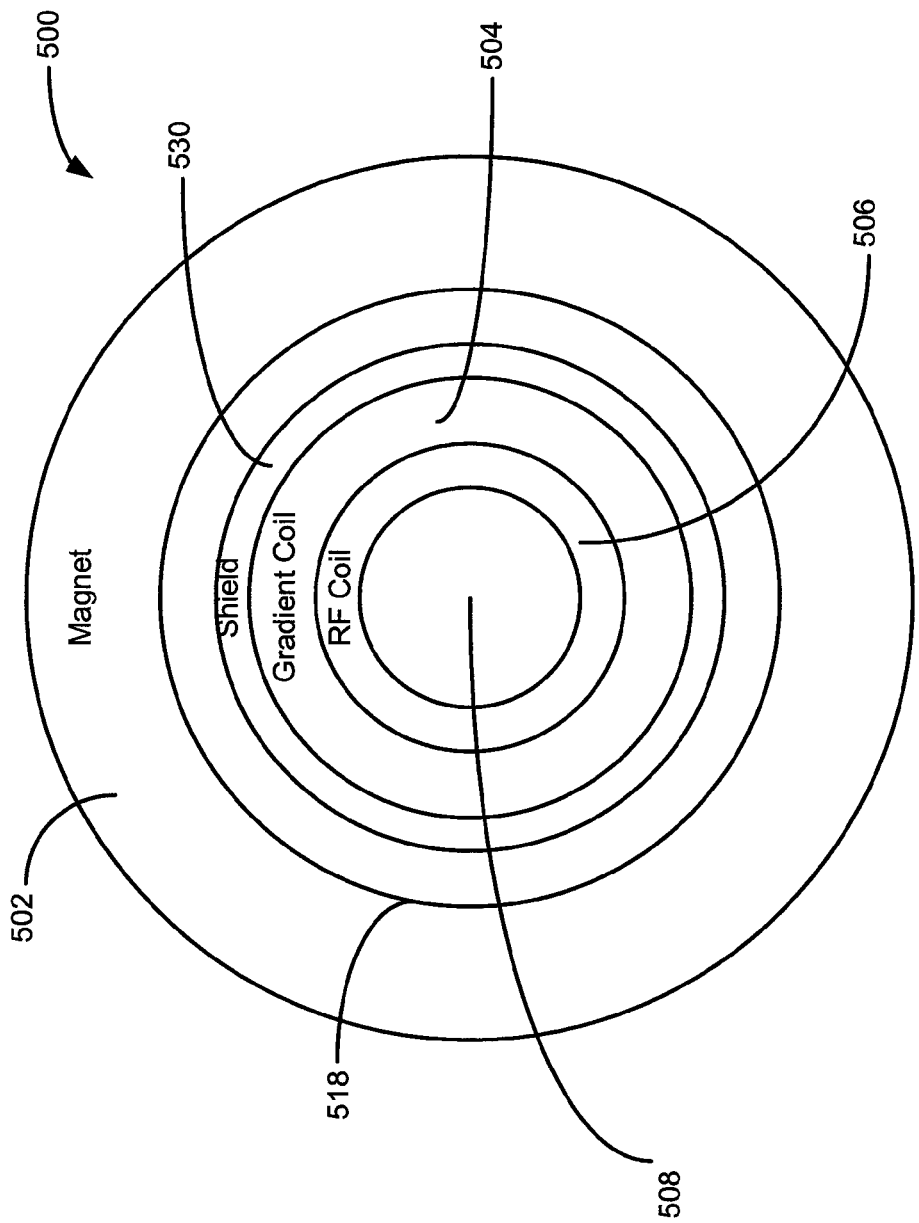
FIG. 5 is a schematic cross-sectional diagram of a magnet assembly showing the relative positions of various elements including an eddy current shield and heater element array in accordance with an embodiment.

As mentioned above, the warm bore 218 (shown in FIG. 2) may also be heated as a result of eddy currents generated (or induced) during operation of the gradient coil assembly 204 (shown in FIG. 2). To prevent eddy currents from heating the warm bore directly, an eddy current shield is provided on an outside surface of the gradient coil assembly. FIG. 5 is a schematic cross-sectional diagram of a magnet assembly showing the relative positions of various elements including an eddy current shield and heater element array in accordance with an embodiment. Magnet assembly 500 includes, among other elements, a superconducting magnet 502, a gradient coil assembly 504, an RF coil 506 and a patient volume or space 508. A combination of an eddy current shield 530 surrounding a gradient coil assembly 504 and an array of heater elements on an interior surface of the warm bore 518 is used to maintain a constant temperature of the warm bore 518. Eddy current shield 530 is composed of a conductive metal and has a thickness of several skin depths or millimeters. For example, the eddy current shield 530 may consist of several layers of copper (e.g., copper foil) wrapped around the gradient coil assembly 504. The eddy current shield 530 may extend the entire length of the gradient coil assembly 504 (e.g., along the length of the gradient coil cylinder) or, alternatively, extend beyond the lengthwise dimensions of the gradient coil 504. The eddy current shield 530 attenuates eddy currents and prevents eddy currents from directly heating the warm bore 518. In addition, the thermal conductivity of the eddy current shield 530 enables the distribution of the heat generated by eddy currents around the eddy current shield 530 to reduce or remove the localized hating characteristics of the eddy currents.

Figure 6:
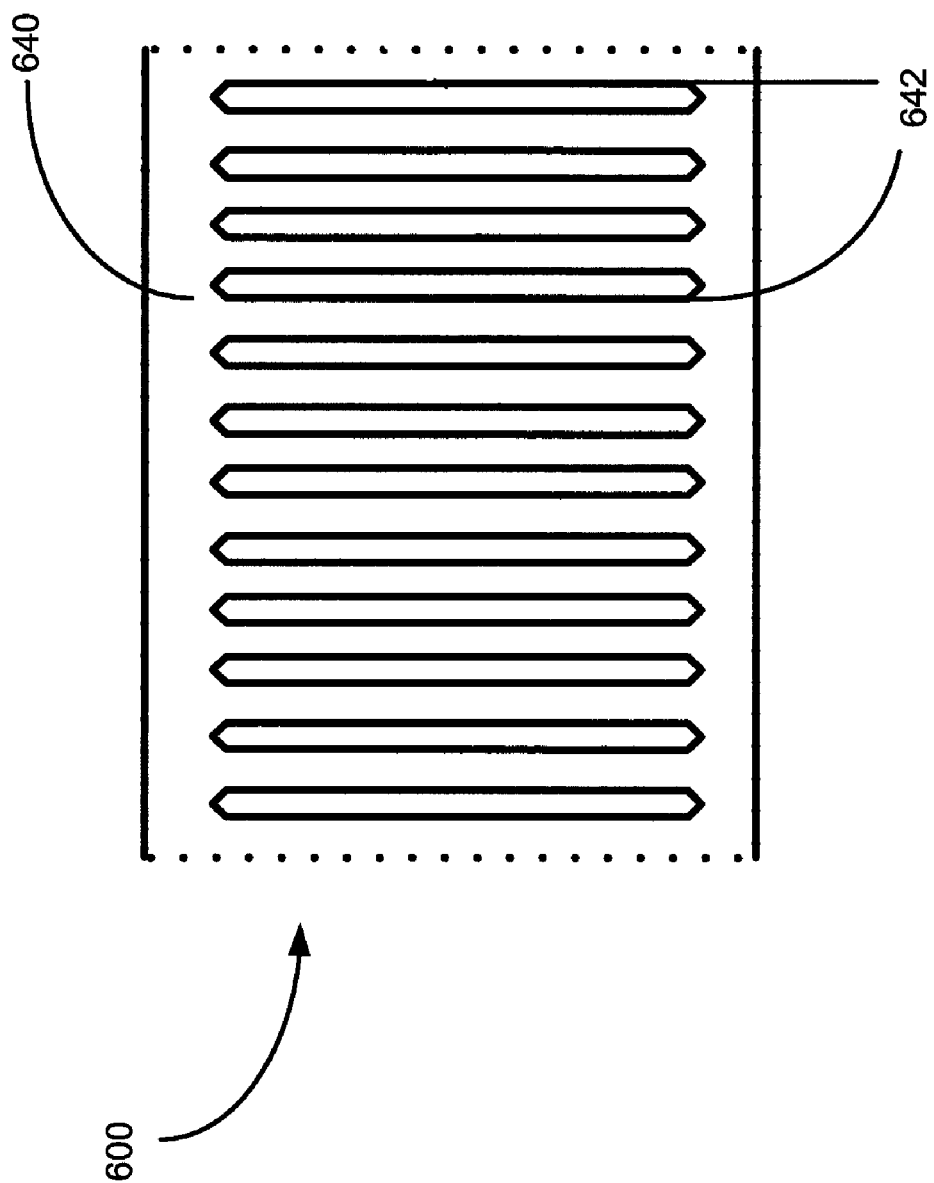
FIG. 6 is a schematic diagram of an exemplary array of heater elements on a warm bore surface in accordance with an embodiment.

Magnet assembly 500 also includes an array heater elements attached to the warm bore 518. The array of heater elements on the warm bore 518 is configured to maintain a predetermined temperature in order to keep the warm bore 518 at a constant temperature. FIG. 6 is a schematic diagram of an exemplary array of heater elements on a warm bore surface in accordance with an embodiment. FIG. 6 shows an exploded view of the inside surface of the warm bore. The array of heater elements 600 is compatible with the magnet assemblies described above with respect to FIGS. 1 and 2 or any similar or equivalent magnet assembly. The array 600 of heater elements is attached to an inside surface 640 of the warm bore. The array 600 includes a plurality of heater elements 642 and is configured to maintain the temperature of the warm bore at a constant predetermined temperature. The heater elements 642 may be attached to the warm bore 640 using an adhesive. The number of heater elements 642 in the array 600 may be based on the number of locations on the warm bore surface 640 necessary to achieve a uniform heating of the warm bore surface 640. In one embodiment, the constant predetermined temperature is an elevated temperature above an ambient temperature. For example, the elevated temperature may be a temperature greater than the maximum warm bore temperature expected as a result of gradient heating at maximum power. In one embodiment, the array of heater elements 600 are controlled as a group. Alternatively, each heater element 642 in the array 600 may be controlled separately or subsets of heater elements 642 may be controlled separately as described above with respect to FIGS. 3 and 4.

Returning to FIG. 2, the drift in the main magnetic field, $B_0$, may also be controlled by reducing the permeability of the magnet warm bore 218. As mentioned, the warm bore 218 is typically made of metal such as stainless steel. The warm bore 218 can be annealed before assembly into the magnet to reduce the permeability of the metal (e.g., stainless steel) used for the warm bore 218. To anneal the warm bore 218, the warm bore 218 is heated to a temperature in the range of 1850-2050° F. for a predetermined period of time, for example, thirty minutes. The warm bore 218 is then quickly cooled to room temperature. Annealing changes the material properties of the metal used for the warm bore 218 including lowering the permeability of the metal used for the warm bore 218. As a result of the reduced permeability, the drift in the main magnetic field caused by heating of the warm bore 218 (e.g., from the gradient coil) is reduced. Warm bore annealing can also remove any increase in permeability caused by cold working of the metal during the manufacturing process. In addition, annealing can reduce the permeability of welds used in manufacturing the warm bore 218 and the effect the welds have on the homogeneity of the main magnetic field.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

What is claimed is:

1. An apparatus for controlling a temperature of a warm bore of a superconducting magnet in a magnetic resonance imaging (MRI) system, the apparatus comprising:
    a plurality of warm bore thermal sensors positioned on a surface of the warm bore;
    a plurality of heater elements positioned on the surface of the warm bore;
    a plurality of heater element thermal sensors, each heater element thermal sensor coupled to one of the plurality of heater elements and configured to monitor a temperature of the corresponding heater element; and
    a controller coupled to the plurality of warm bore thermal sensors and the plurality of heater element thermal sensors, the controller configured to control each of the plurality of heater elements to maintain a predetermined temperature of the warm bore.

2. An apparatus according to claim 1, wherein the predetermined temperature is an elevated temperature above ambient temperature.

3. An apparatus according to claim 1, further comprising at least one current source coupled to each heater element and the controller.

4. An apparatus according to claim 3, wherein the at least one current source receives at least one control signal from the controller.

5. An apparatus according to claim 4, wherein, in response to the at least one control signal, the at least one current source adjusts a current provided to each heater element.

6. An apparatus according to claim 1, wherein the warm bore thermal sensors are thermocouples.

7. An apparatus according to claim 1, wherein the warm bore thermal sensors are resistance temperature devices.

8. An apparatus according to claim 1, wherein the warm bore thermal sensors are thermistors.

9. A method for controlling a temperature of a warm bore of a superconducting magnet in a magnetic resonance imaging (MRI) system, the magnet including a plurality of heater elements positioned on a surface of the warm bore, the method comprising:
    monitoring the temperature of the warm bore;
    monitoring a temperature of each heater element in the plurality of heater elements; and
    adjusting the temperature of each heater element to maintain a predetermined temperature of the warm bore.

10. A method according to claim 9, wherein the predetermined temperature is an elevated temperature above ambient temperature.

11. A method according to claim 9, wherein adjusting the temperature of each heater element to maintain a predetermined temperature comprises adjusting a current provided to the heater element.

12. An apparatus for controlling a temperature of a warm bore of a superconducting magnet in a magnetic resonance imaging (MRI) system, the apparatus comprising:
    a plurality of warm bore thermal sensors positioned on a surface of the warm bore;
    a plurality of heater elements positioned on the surface of the warm bore;
    a plurality of heater element thermal sensors, each heater element thermal sensor coupled to a subset of the plurality of heater elements and configured to monitor a temperature of the corresponding subset of heater elements; and
    a controller coupled to the plurality of warm bore thermal sensors and the plurality of heater element thermal sensors, the controller configured to control the subset of the plurality of heater elements to maintain a predetermined temperature of the warm bore.

13. An apparatus according to claim 12, wherein the predetermined temperature is an elevated temperature above ambient temperature.

14. An apparatus for controlling a temperature of a warm bore of a superconducting magnet of a magnetic resonance imaging (MRI) system, the MRI system including a gradient coil assembly mounted inside and circumferentially surrounded by the superconducting magnet, the apparatus comprising:
    an eddy current shield disposed around an outer surface of the gradient coil assembly;
    a plurality of heater elements positioned on a surface of the warm bore; and
    a plurality of warm bore thermal sensors positioned on the surface of the warm bore.

15. An apparatus according to claim 14, wherein the eddy current shield is composed of a conductive metal.

16. An apparatus according to claim 14, wherein the conductive metal is copper.

17. An apparatus according to claim 14, wherein the plurality of heater elements are configured to maintain a predetermined temperature of the warm bore.

18. An apparatus according to claim 17, wherein the predetermined temperature is an elevated temperature above ambient temperature.

19. An apparatus according to claim 16, wherein the eddy current shield comprises a plurality of layers of a copper foil.

20. An apparatus according to claim 14 further comprising a plurality of heater element thermal sensors, each heater element thermal sensor coupled to one of the plurality of heater elements and configured to monitor the temperature of the corresponding heater element.

21. An apparatus according to claim 20, further comprising a controller coupled to the plurality of warm bore thermal sensors and the plurality of heater element thermal sensors, the controller configured to control each of the plurality of heater elements to maintain a predetermined temperature of the warm bore.

* * * * *